(12) United States Patent
Dauer et al.

(10) Patent No.: US 10,553,383 B2
(45) Date of Patent: Feb. 4, 2020

(54) ELECTRICAL FUSE ELEMENT

(71) Applicant: LEONI BORDNETZ-SYSTEME GMBH, Kitzingen (DE)

(72) Inventors: Michael Dauer, Theilheim (DE); Tino Frank, Schwarzach am Main (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 0 days.

(21) Appl. No.: 16/106,321

(22) Filed: Aug. 21, 2018

(65) Prior Publication Data

US 2019/0066960 A1 Feb. 28, 2019

(30) Foreign Application Priority Data

Aug. 22, 2017 (DE) .................. 10 2017 214 682

(51) Int. Cl.
| | |
|---|---|
| *H05K 1/18* | (2006.01) |
| *H01H 85/02* | (2006.01) |
| *H01H 85/055* | (2006.01) |
| *H01H 85/143* | (2006.01) |
| *H01H 85/165* | (2006.01) |
| *H01H 85/20* | (2006.01) |
| *H01H 85/00* | (2006.01) |

(52) U.S. Cl.
CPC ...... *H01H 85/0241* (2013.01); *H01H 85/055* (2013.01); *H01H 85/143* (2013.01); *H01H 85/165* (2013.01); *H01H 85/205* (2013.01); *H05K 1/181* (2013.01); *H01H 85/0026* (2013.01); *H01H 2085/0275* (2013.01); *H05K 2201/10181* (2013.01)

(58) Field of Classification Search
CPC .......... H01H 85/0241; H01H 85/0411; H01H 85/055; H01H 85/165; H01H 85/205; H01H 85/143; H01H 2085/0414; H01H 2085/0275; H05K 1/181; H05K 2201/10181
See application file for complete search history.

(56) References Cited

U.S. PATENT DOCUMENTS

| | | | |
|---|---|---|---|
| 4,755,785 A * | 7/1988 | Bernstein | ........... H01H 85/2045 337/186 |
| 4,851,806 A | 7/1989 | Rohrer et al. | |
| 5,140,294 A | 8/1992 | Rohrer et al. | |
| 6,577,222 B1 | 6/2003 | Krueger et al. | |

(Continued)

FOREIGN PATENT DOCUMENTS

| | | |
|---|---|---|
| CN | 204013435 U | 12/2014 |
| DE | 8704621 U1 | 8/1987 |

(Continued)

*Primary Examiner* — Ishwarbhai B Patel
(74) *Attorney, Agent, or Firm* — Laurence A. Greenberg; Werner H. Stemer; Ralph E. Locher

(57) ABSTRACT

An electric fuse element for arrangement on a printed circuit board is specified. The fuse element is formed as an SMD component and has a cuboidal insulating housing, two contact elements for electrical connection to the printed circuit board and at least one support element. The contact elements are arranged on a bottom side of the insulating housing, wherein the contact elements emerge at the bottom side of the insulating housing by way of a subregion, which has a contact area on the end side. The emerging subregion having the contact areas is of angled form.

10 Claims, 2 Drawing Sheets

(56) References Cited

U.S. PATENT DOCUMENTS

2008/0191832 A1* 8/2008 Tsai .................... H01H 69/022
                                                        337/297
2017/0236675 A1   8/2017 Aberin et al.

FOREIGN PATENT DOCUMENTS

| EP | 0314895 A1 | 5/1989 |
| EP | 0471922 A2 | 2/1992 |
| EP | 2040281 A2 | 3/2009 |
| GB | 2203004 A  | 10/1988 |

* cited by examiner

ELECTRICAL FUSE ELEMENT

BACKGROUND OF THE INVENTION

Field of the Invention

The invention relates to an electric fuse element.

Electric fuse elements are arranged in virtually every electrical circuit and/or every electric circuit to form an overcurrent protection system.

Fuse elements are often formed as so-called fusible links and are used, for example, in the field of motor vehicles. Fusible links conventionally have a stamped and bent sheet-metal part housed by an insulating housing and having a fuse region having a fusible conductor, through which a current of a circuit that is to be protected flows. If the value of the current increases, for example on account of a short circuit, and if the value of the current exceeds a current threshold value, the fusible conductor melts and consequently "opens" the circuit to protect electrical devices and/or components connected to the circuit.

Fuse elements of this kind are also arranged in electrical circuits on printed circuit boards, preferably to protect electrical lines, for example in a motor vehicle. The fuse elements usually have at least two contact elements, referred to as contact legs, which are used to insert said fuse elements into a fuse holder in the mounted state. The fuse holder is, for example, a stamped and bent sheet-metal part or else a printed circuit board, through which the contact elements are inserted.

Populating printed circuit boards with fuse elements today is sometimes complex.

BRIEF SUMMARY OF THE INVENTION

Proceeding therefrom, the invention is based on the object of specifying an electric fuse element that can be mounted in a simple manner. The invention is furthermore based on the object of specifying a printed circuit board having a fuse element of this kind.

The object is achieved according to the invention by an electric fuse element for arrangement on a printed circuit board.

The electric fuse element has an, in particular cuboidal, insulating housing having two opposite main sides, a bottom side and a top side opposite the bottom side. The insulating housing furthermore has two opposite narrow sides that connect the two opposite main sides. For the arrangement on the printed circuit board and for electrical connection, the electric fuse element has two contact elements. The contact elements are arranged on the bottom side of the insulating housing and emerge from the insulating housing at said bottom side. The emerging subregion of the contact elements has contact areas on the end side and the emerging subregion is of angled form overall. The contact elements initially emerge from the insulating housing in a longitudinal direction and are angled once or else several times with respect to said longitudinal direction.

At least one support element is furthermore arranged on the bottom side of the insulating housing of the fuse element. The support element has a support area, by means of which the fuse element is supported on the printed circuit board.

The fuse element is formed, in particular, in the manner of a surface-mount-device component (SMD component). An SMD component is generally understood to mean an, in particular electronic, component, which is arranged, for example soldered, on the printed circuit board by means of contact areas by means of surface-mount technology (SMT). A printed circuit board is understood in the present case according to general usage to mean a circuit board and, in particular, a printed circuit, for example in the manner of a PCB. Due to the angled configuration of the emerging subregion, the contact areas are brought into an advantageous orientation parallel to the surface on which the fuse element is arranged.

This produces a fuse element that can be arranged on the printed circuit board in a simple manner by means of standard SMD methods. The configuration as an element that can be surface-mounted achieves, in particular, the following advantages:

Firstly, a continuous SMD manufacturing process is made possible. Further electronic SMD components are usually arranged on the printed circuit board. Continuous is understood in the present case to mean that the manufacture of an SMD printed circuit board of this kind for a prescribed purpose does not have to be interrupted for mounting of a fuse element.

Furthermore, the introduction of insertion holes is not required for populating the printed circuit board, with the result that a manufacturing step is saved.

In addition, standard populating methods, for example a pick-and-place method, are used for the population.

Reliable support on the printed circuit board is also ensured owing to the support element. This configuration is based on the consideration of relieving the load on the contact elements, in particular the contact areas, with respect to the acting weight force and/or with respect to the arising tilting moments, onto the mounted fuse element in the direction of the printed circuit board. The support element and the support area are formed, in particular, as a part of the insulating housing in the manner of a one-piece, in particular monolithic, configuration. As an alternative, the contact element and the support area are arranged, for example adhesively bonded, on the insulating housing as an additional part thereof. The insulating housing is preferably a molded insulating housing. As an alternative, the insulating housing is a multipart housing. In the present case, within the context of the manufacture of the fuse element, individual parts of the insulating housing are connected to one another in a materially bonded manner, for example adhesively bonded or welded.

In an expedient development, the contact areas and the support area are arranged within a plane. Owing to the arrangement within a plane, the contact areas and the support area bear precisely on the printed circuit board so that a high degree of stability is provided. As an alternative or in addition, the support area is connected to the printed circuit board in a materially bonded manner, for example adhesively bonded. This furthermore makes it possible to populate the printed circuit board on both sides before soldering, since, when the printed circuit board is rotated during and/or for the purpose of population, the fuse element is held by the materially bonded connection.

The contact areas are expediently arranged in a manner angled at a bending angle of 90°. The contact areas are therefore arranged at a right angle with respect to the mentioned longitudinal direction. The emerging subregion is formed in this case in particular in an L shape. This makes it possible to arrange the fuse element, in particular, in a manner oriented vertically to the printed circuit board. In other words: the fuse element is arranged upright on the printed circuit board. This achieves, in particular, an advantage with respect to a needed space requirement of the fuse element on the printed circuit board. Other bending angles can also be provided depending on the desired orientation. In an alternative variant, the emerging subregion also has more than one angled portion and is formed, for example, in the manner of a Z. In this variant, the contact area is oriented, for example, parallel to the longitudinal direction. Owing to the double bending, however, the fuse element is held at a distance from the printed circuit board, for example, in the case of a horizontal or lying-down arrangement in order to prevent the fuse element from bearing on the printed circuit board.

The fuse element is preferably formed as a fusible link. The fusible link preferably has a bent sheet-metal part, which has the two contact elements and a fuse region having a fusible conductor. A fusible link is understood in the present case according to general usage to mean a fuse element for protection against an overcurrent within a circuit. The fusible conductor melts as soon as a current flowing through it exceeds a prescribed threshold value and consequently separates the circuit.

The fusible link is arranged in the insulating housing, in particular, in a non-form-fitting manner. In other words: the fusible link, in particular the fusible conductor, is arranged inside the insulating housing, for example in the open air. The insulating housing consequently does not bear against the fusible conductor. This arrangement is also referred to as "wire in air technology".

The fuse element is generally formed as a blade-type fuse and, in particular, has no further components apart from the bent sheet-metal part.

In this formation, the advantage is that fusible links have proven to be particularly suitable, in particular, for protection against overcurrents and ensure a simple and cost-effective realization of a fuse element.

Thin contact tracks or contact pads are preferably arranged between the contact areas and the printed circuit board for the purpose of making electrical contact with the printed circuit board.

The bottom side of the insulating housing is preferably a narrow side so that the insulating housing in connection with the already mentioned contact elements, which are angled at a right angle, is arranged, in a mounted position, orthogonally to the printed circuit board. In other words: on account of the narrow sides of the insulating housing of the fuse element, said insulating housing has a cuboidal shape in the manner of a "flattened" cuboid. In the mounted position, the fuse element is consequently arranged "upright" on the printed circuit board. The fuse element is thus generally formed in the manner of a blade-type fuse, which is mounted in perpendicular fashion.

This achieves, in particular, a lower effective area requirement on the printed circuit board than, for example, in the case of arrangement of the fuse element with a main side. The low area requirement is advantageous, in particular, with respect to a field of application of the fuse element and consequently of the printed circuit board in which an area limit is required for the printed circuit board. A field of application of this kind is, for example, the automotive industry.

To ensure a compact arrangement of the fuse element on the printed circuit board, in accordance with an expedient configuration, the contact areas project laterally beyond the insulating housing at most by an insulating housing width, preferably at most by half of the insulating housing width.

The top side of the insulating housing preferably has a planar surface. A planar surface is understood in the present case to mean a planar area, which does not have, in particular, any depressions, dips and/or deformations (bumps or pockets). In this configuration, the advantage can be found in the population of the printed circuit board with the fuse element. That is to say that, in particular, mechanized methods, for example a pick-and-place method, are used for populating the printed circuit board. Populating is generally understood in the present case to mean arranging components, for example, on a printed circuit board. Such populating is usually effected by means of the mentioned pick-and-place method, for example by means of a mechanical negative-pressure arm, which suctions a respective component by means of a nozzle and places it at a prescribed position on a printed circuit board. The planar surface has proven particularly suitable for suctioning the fuse element securely by means of the nozzle. The advantage of this configuration can be found in the use of conventional SMD methods. Consequently, no additional populating method is necessary for populating the printed circuit board with the fuse element.

To form a material bond, in particular a solderability, in the case of the arrangement of the fuse element on the printed circuit board, the contact elements are preferably made of a metal and are at least partly, for example the contact areas, refined. Refining is understood to mean coating with a refining metal, for example silver and/or tin.

According to a preferred configuration, the insulating housing has a plastic capable of reflow, for example a liquid crystal polymer (LCP) and is preferably formed entirely therefrom. Capable of reflow is understood in the present case to mean a property of a material in which the material during and/or after a soldering method, in particular in the manner of a reflow-soldering method, does not exhibit any, in particular, thermal, damage, for example, melted zones. A reflow-soldering process is understood in the present case to mean a known soldering method for producing printed circuit boards in which a special soldering paste is applied before the soldering process to locations at which a component is soldered. The components are then arranged at their respective location on the printed circuit board, for example, by means of the pick-and-place method. The soldering paste applied beforehand serves here for provisional fixing of the components in the manner of an adhesive. Only after the printed circuit board has been populated is the actual soldering process effected by virtue of the entire printed circuit board being heated to a temperature with a value in the range of, for example, 250° C. to 300° C. so that the soldering paste liquefies and the components are soldered irreversibly onto the printed circuit board after cooling. A soldering method of this kind is used, in particular, in SMD printed circuit boards.

The object is furthermore achieved according to the invention by a printed circuit board having an electric fuse element attached, in particular soldered, thereto, as has been described above.

The advantages and preferred configurations stated with respect to the fuse element can be applied analogously to the printed circuit board and vice versa.

The fuse element and the printed circuit board are preferably used in a motor vehicle. The printed circuit board is arranged, for example, in a fuse box.

BRIEF DESCRIPTION OF THE SEVERAL VIEWS OF THE DRAWING

An exemplary embodiment of the invention will be explained in more detail below with reference to the figures. These each show, partly in highly simplified representations.

DESCRIPTION OF THE INVENTION

In the figures, identically acting parts are illustrated with the same reference designitions.

Figure 1:
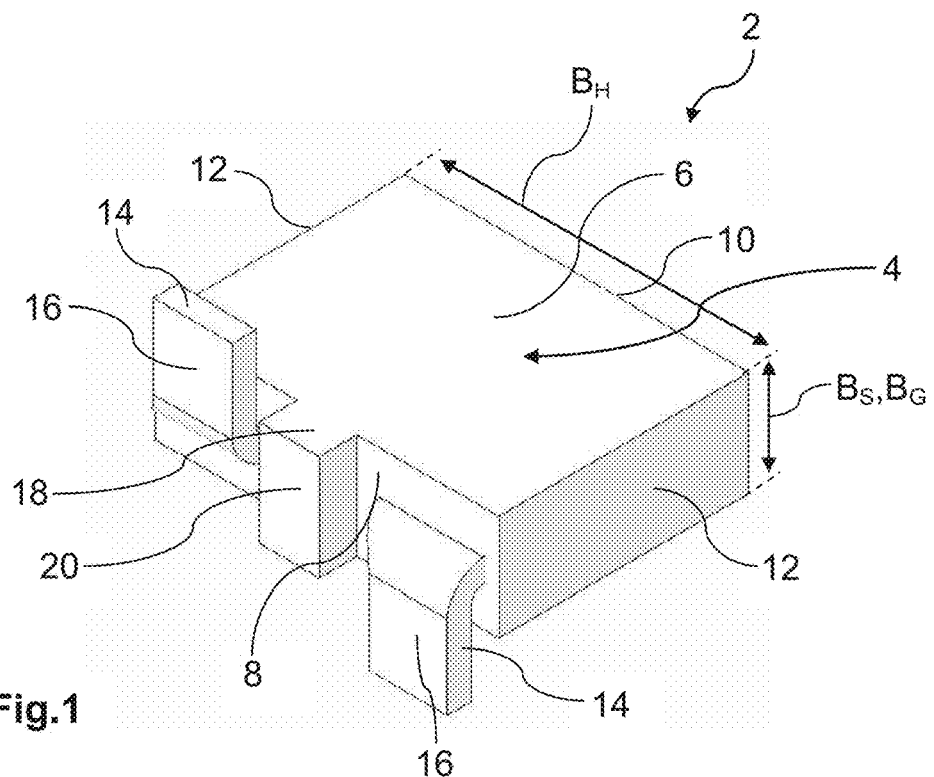
FIG. 1 a perspective view of an electric fuse element.

FIG. 1 illustrates a transverse view of an electric fuse element 2 for arrangement on a printed circuit board 3 (illustrated in FIG. 2), for example a PCB. PCB is understood in the present case to mean, in particular, a printed circuit and/or a circuit board. A printed circuit is understood specifically to mean a circuit on a printed circuit board in which the conductor tracks are "printed" on a carrier material of the printed circuit board, for example. A plastic, for example, serves as carrier material. In the exemplary embodiment, the fuse element 2 is formed as a surface-mount-device component (SMD component).

Furthermore, the fuse element 2 has a cuboidal insulating housing 4 having two opposite main sides 6 (one main side cannot be seen in FIG. 1), a bottom side 8 and a top side 10 opposite the bottom side 8. To form the cuboidal shape, the insulating housing 4 also has two opposite narrow sides 12. The two opposite main sides 6 and the narrow sides 12 extending between said bottom side 8 and the top side 10 in a vertical direction and having a common height H. The narrow sides 12 have a width $B_S$ that extends in a transverse direction (y-direction) and the main sides 6 have a width $B_H$ that extends in a longitudinal direction (x-direction). In the exemplary embodiment, the insulating housing 4 has a plastic capable of reflow, for example polyetherketone or a liquid crystal polymer (LCP). This makes it possible, in particular, to arrange the fuse element 2 on the printed circuit board 3 by means of standard methods.

In the exemplary embodiment, the width $B_S$ of the narrow sides 12 has a lower value than the width $B_H$ of the main sides 6.

In the exemplary embodiment, the width $B_S$ of the narrow sides corresponds to an insulating housing width $B_G$. In the exemplary embodiment, the fuse element 2 is formed as a blade-type fuse as a result.

The fuse element 2 has two contact elements 14 for electrical connection to the printed circuit board 3. The contact elements 14 emerge at the bottom side 8 of the insulating housing 4 out of said insulating housing and have contact areas 16, which are angled at a right angle. In this case, the contact areas 16 are each angled in opposite directions to a respective main side 6. The contact elements 14 are part of a bent sheet-metal part 22 (illustrated in FIG. 3).

In a state arranged on the printed circuit board 3, the fuse element 2 has an alignment oriented orthogonally to the printed circuit board 3. In other words: the fuse element 2 is arranged, for example soldered, "upright" onto the printed circuit board 3 so that the top side 10 is oriented parallel to the printed circuit board 3.

For reliable contact-making, the contact elements 14 are made from a metal, for example copper or zinc, and are additionally at least partly refined, for example tin-coated or silver-coated. At least partly refined is understood in the present case to mean that at least the contact areas 16 are, for example, tin-coated and thus able to be soldered onto the printed circuit board 3, for example, by means of a reflow method.

In the exemplary embodiment, the top side 10 of the fuse element 2 has a planar surface. A planar surface is understood in the present case to mean a flat surface, which does not have, in particular, any dips and/or grooves, for example.

On account of the planar surface, in particular, population of the printed circuit board 3 with the fuse element 2 is made possible, in the manner of a pick-and-place method. In the case of such a pick-and-place method, the individual components are suctioned by means of a suction nozzle, which is arranged, for example, on a robot arm controlled by a computer, and arranged on the printed circuit board 3. To take up the fuse element 2 by means of the suction nozzle, a planar surface of the fuse element 2 of this kind is essential.

In the exemplary embodiment, the fuse element 2 furthermore has a support element 18 having a support area 20. The support element 18 and the support area 20 serve to support the arranged fuse element 2 on the printed circuit board 3 so that the contact elements 14 preferably serve for making electrical contact and do not also have to "bear" the weight of the fuse element 2. In addition, the fuse element has advantages with respect to vibration resistance as a result.

Figure 2:
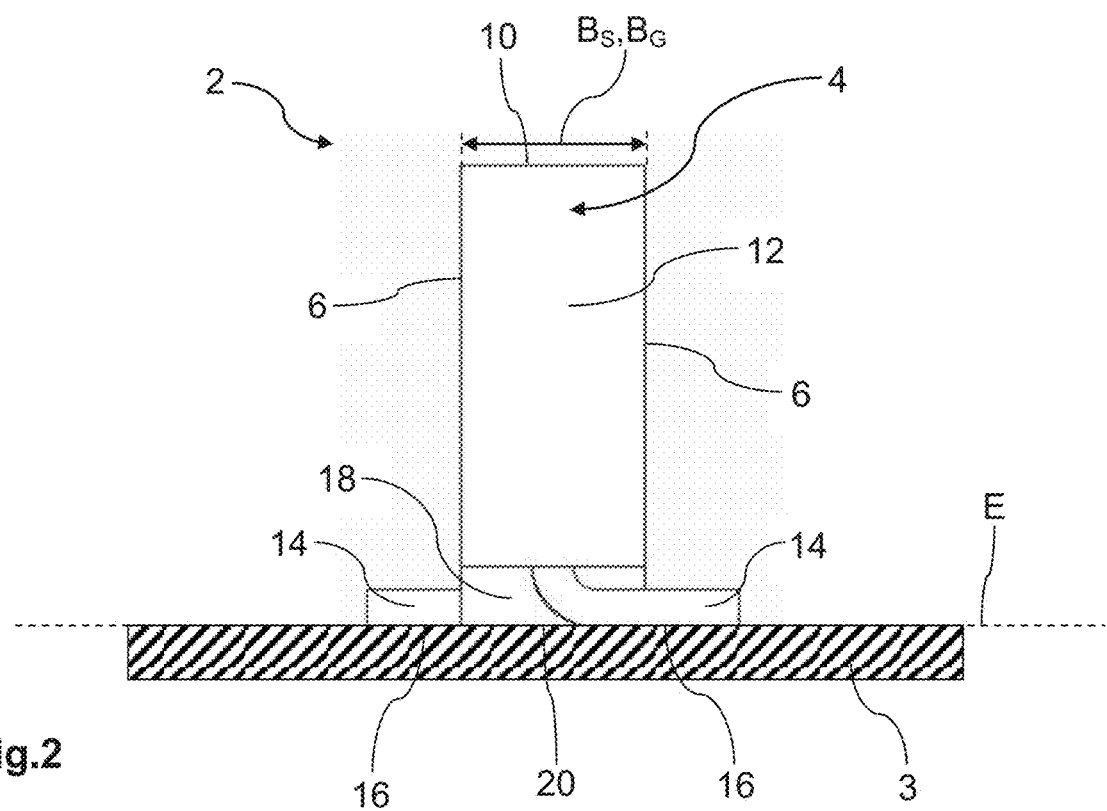
FIG. 2 a side view of the electric fuse element arranged on a printed circuit board and FIG. 3 a side view of the fuse element formed to form a fusible link.

FIG. 2 illustrates a side view of the electric fuse element 2. FIG. 2 is, in particular, not subject to any scale. The components shown serve exclusively for graphical illustration of an exemplary embodiment of the invention.

In the exemplary embodiment, the contact areas 16 and the support area 20 are arranged within a plane E. This guarantees support of the fuse element 2 on the printed circuit board 3.

Furthermore, in the exemplary embodiment, the contact areas 16 project laterally beyond the insulating housing 4 at most by half of the insulating housing width $B_G$. As an alternative, the contact areas 16 project laterally beyond the insulating housing at most by a value of the insulating housing width $B_G$.

This configuration is based, in particular, on an increase in stability, in particular with respect to arising lateral forces, in comparison to a configuration in which, for example, the contact elements 14 do not project laterally beyond the insulating housing.

In the exemplary embodiment, the fuse element 2 is formed as a fusible link.

Figure 3:
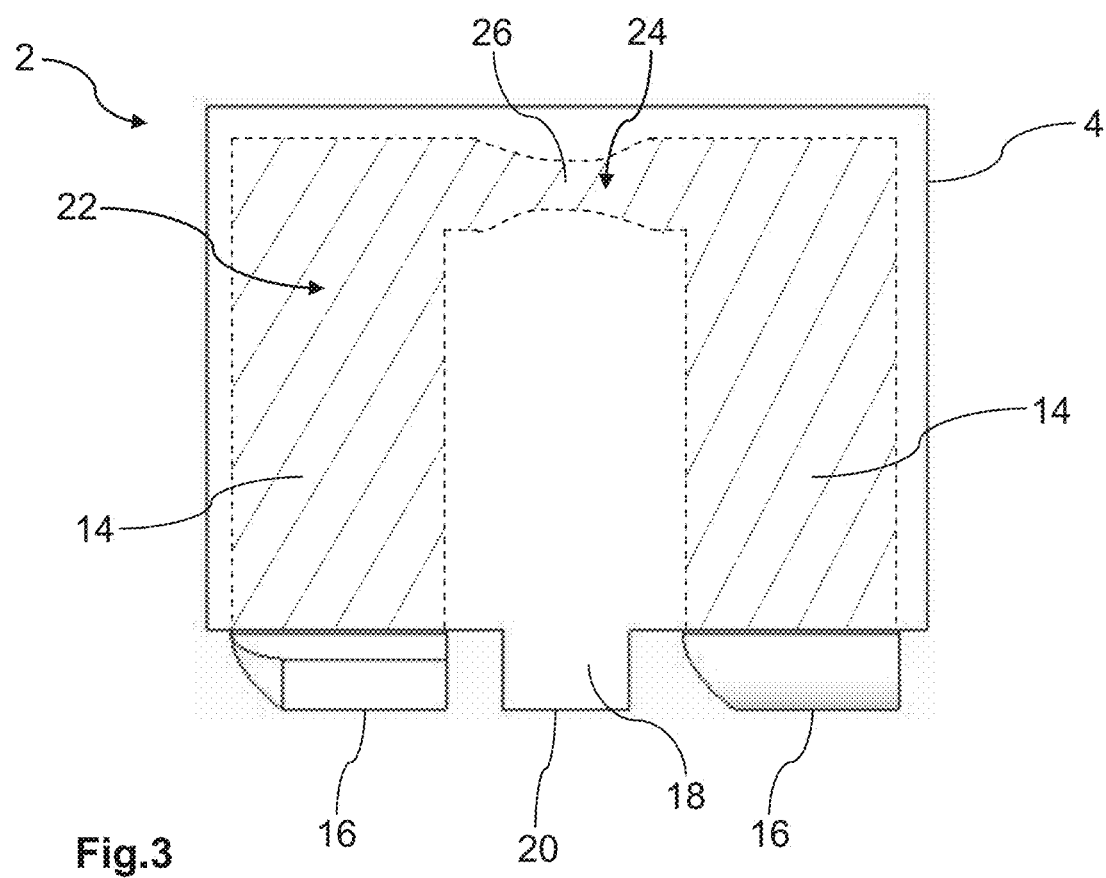

FIG. 3 shows such a formation of the fuse element 2. The fuse element 2 has to this end a bent sheet-metal part 22, which has the contact elements 14 and the contact areas 16. The bent sheet-metal part 22 also has a fuse region 24 having a fusible conductor 26. The fuse region 24 connects the two contact elements 14 to one another within the insulating housing 4. In the exemplary embodiment, the bent sheet-metal part has a metal, for example zinc, and is at least partly refined.

In the following text, the functioning of a fusible link of this kind is briefly dealt with once more:

The fusible link is usually arranged in a circuit that is to be protected so that the current flowing through the circuit also flows through the fusible link. When a current threshold value is exceeded, for example due to a short circuit in the circuit, the fusible conductor 26 of the fuse region 24 melts on account of the arising thermal loading. As a result of this, the circuit is "opened" and is consequently free of current. Further lines, components and/or devices connected to the circuit are consequently protected against an overcurrent.

In the exemplary embodiment, the fusible conductor 26 is of tapered form. The tapering is correlated progressively with the current threshold value (current value from which the fusible link is "triggered"). That is to say, the thicker the fusible conductor 26, the greater the current threshold value at which the fusible conductor 26 melts. As a result, a simple realization of fusible links for different circuits that are to be protected and for different current threshold values is achieved.

LIST OF REFERENCE DESIGNATIONS

2 Electric fuse element
3 Printed circuit board
4 Insulating housing
6 Main sides
8 Bottom sides
10 Top side
12 Narrow side
14 Contact element
16 Contact area
18 Support element
20 Support area
22 Bent sheet-metal part
24 Fuse region
26 Fusible conductor
$B_G$ Insulating housing width
$B_H$ Width of the main side
$B_S$ Width of the narrow side
E Plane

The invention claimed is:

1. An electric fuse element for use on a printed circuit board as a surface mounted device (SMD) component, the electric fuse element comprising:
   an insulating housing having a bottom side;
   two contact elements for electrical connection to the printed circuit board, said contact elements each emerge from said housing at said bottom side of said insulating housing aligned along a common axis, and each has a contact area on an end side, and said contact area is of angled form; and
   at least one support element, disposed on said bottom side and having a support area for support on the printed circuit board;
   said contact areas and said support area being disposed within a common plane, each said contact area being a flat area, said contact areas being bent in opposing directions relative to one another and said contact areas projecting laterally beyond opposite sides of said insulated housing in a direction transverse to said common axis.

2. The electric fuse element according to claim 1, wherein said contact area is angled at 90°.

3. The electric fuse element according to claim 1, wherein the electric fuse element is a fusible link.

4. The electric fuse element according to claim 3, wherein:
   the fusible link has a bent sheet-metal part; and
   said bent sheet-metal part includes said two contact elements and defines a fuse region with a fusible conductor.

5. The electric fuse element according to claim 1, wherein said contact areas project laterally beyond said said main sides at most by half of said narrow side width.

6. The electric fuse element according to claim 1, wherein said top side has a planar surface.

7. The electric fuse element according to claim 1, wherein said contact elements are made from a metal and are at least partly refined.

8. The electric fuse element according to claim 1, wherein said insulating housing has a plastic capable of reflow.

9. An electric fuse element for use on a printed circuit board as a surface mounted device (SMD) component, the electric fuse element comprising:
   an insulating housing having a cuboidal shape with a bottom side, a top side, two opposite main sides, and two opposite narrow sides, said two opposite main sides and said two opposite narrow sides extending between said bottom side and said top side in a vertical direction and having a common height, said narrow sides having a width extending in a transverse direction (y-direction) and said main sides having a width extending in a longitudinal direction (x-direction), said width of said narrow sides being less than said width of said main sides and said height being greater than said width of said narrow side;
   two contact elements for electrical connection to the printed circuit board, said contact elements each emerge at said bottom side of said insulating housing by way of a subregion, and each has a contact area on an end side, and said contact area is of angled form; and
   at least one support element, disposed on said bottom side and having a support area for support on the printed circuit board;
   said contact areas and said support area being disposed within a common plane, each said contact area being a flat area, said support area for being disposed on the printed circuit board and orientating said insulating housing and the vertical direction orthogonally to the printed circuit board;
   said contact areas projecting laterally beyond said insulating housing in the transverse direction.

10. An electric fuse element for use on a printed circuit board as a surface mounted device (SMD) component, the electric fuse element comprising:
    an insulating housing having a cuboidal shape with a bottom side, a top side, two opposite main sides, and two opposite narrow sides, said two opposite main sides and said two opposite narrow sides extending between said bottom side and said top side and having a common height, said narrow sides having a narrow side width orthogonal to said height and said main sides having a main side width orthogonal to said height, said width of said narrow sides being less than said width of said main sides;
    two contact elements for electrical connection to the printed circuit board, said contact elements each emerging from said insulating housing at said bottom side of said insulating housing, and each has a contact area on an end side, and said contact area is of angled form; and
    at least one support element, disposed on said bottom side and having a support area for support on the printed circuit board;
    said contact areas and said support area being disposed within a common plane, each said contact area being a flat area, said support area for being disposed on the printed circuit board and orientating said main sides and said narrow sides orthogonally to the printed circuit board;
    said contact areas projecting in opposing directions to one another laterally beyond said main sides in the transverse direction.

* * * * *